United States Patent
Lee et al.

(10) Patent No.: US 9,300,265 B2
(45) Date of Patent: Mar. 29, 2016

(54) WIRELESS COMMUNICATION DEVICE, METHOD AND POWER AMPLIFIER OF THE SAME

(71) Applicant: HTC Corporation, Taoyuan County (TW)

(72) Inventors: Chien-Hua Lee, Taoyuan County (TW); Yen-Chuan Lin, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 0 days.

(21) Appl. No.: 14/562,769

(22) Filed: Dec. 7, 2014

(65) Prior Publication Data

US 2015/0244338 A1    Aug. 27, 2015

Related U.S. Application Data

(60) Provisional application No. 61/945,140, filed on Feb. 27, 2014.

(51) Int. Cl.
| | |
|---|---|
| H04B 1/00 | (2006.01) |
| H03G 3/30 | (2006.01) |
| H03F 3/19 | (2006.01) |
| H03F 1/56 | (2006.01) |
| H03F 3/24 | (2006.01) |
| H03F 3/68 | (2006.01) |

(52) U.S. Cl.
CPC .............. *H03G 3/3042* (2013.01); *H03F 1/56* (2013.01); *H03F 3/19* (2013.01); *H03F 3/245* (2013.01); *H03F 3/68* (2013.01); *H03F 2200/111* (2013.01); *H03F 2200/222* (2013.01); *H03F 2200/318* (2013.01); *H03F 2200/387* (2013.01); *H03F 2200/411* (2013.01); *H03F 2200/451* (2013.01); *H03F 2203/21103* (2013.01)

(58) Field of Classification Search
USPC ............. 455/102, 127.4, 550.1, 234.1, 127.3, 455/103; 330/126, 277, 133, 144, 51, 302
See application file for complete search history.

(56) References Cited

U.S. PATENT DOCUMENTS

| | | | | |
|---|---|---|---|---|
| 2005/0215206 | A1* | 9/2005 | Granstrom ........... | H04B 1/0483 455/102 |
| 2006/0267682 | A1* | 11/2006 | Grebennikov ........ | H03F 1/0277 330/51 |
| 2007/0222697 | A1* | 9/2007 | Caimi .................... | H01Q 1/243 343/861 |
| 2010/0291888 | A1* | 11/2010 | Hadjichristos ........ | H03F 1/0277 455/127.4 |
| 2010/0321110 | A1* | 12/2010 | Ichitsubo ............... | H03F 3/195 330/144 |
| 2011/0316637 | A1* | 12/2011 | Pletcher ................ | H03F 1/0277 330/310 |
| 2013/0005392 | A1* | 1/2013 | Chen ..................... | H04B 1/0057 455/550.1 |

\* cited by examiner

*Primary Examiner* — Ganiyu A Hanidu
(74) *Attorney, Agent, or Firm* — CKC & Partners Co., Ltd.

(57) ABSTRACT

A wireless communication device that includes a power amplifier and an antenna is provided. The power amplifier includes a first and a second power amplifying paths, a first and a second selection circuits, first matching circuits and second matching circuits. The first and the second power amplifying paths receive a first and a second input signals respectively. The first selection circuit selects one of the first matching circuits according to a frequency band of the first input signal to perform a first matching process to generate a first output signal. The second selection circuit selects one of the second matching circuits according to a frequency band of the second input signal to perform a second matching process to generate a second output signal. The antenna is coupled to the power amplifier to transmit the first and/or the second output signals.

20 Claims, 3 Drawing Sheets

WIRELESS COMMUNICATION DEVICE, METHOD AND POWER AMPLIFIER OF THE SAME

RELATED APPLICATIONS

This application claims the priority benefit of U.S. Provisional Application Ser. No. 61/945,140, filed Feb. 27, 2014, the full disclosures of which are incorporated herein by reference.

BACKGROUND

1. Field of Invention

The present invention relates to a communication technology. More particularly, the present invention relates to a wireless communication device, method and power amplifier of the same.

2. Description of Related Art

In wireless communication system, a transceiver is often disposed to perform processing on data signals, such as encoding, modulation, conversion between digital and analog forms, filtering and power amplifying, to generate radio frequency signals that can be transmitted by the antenna. The transceiver is able to support the signals of different modes or different frequency bands. The signals of different modes or different frequency bands correspond to different wireless transmission technologies such as global system for mobile communications (GSM), general packet radio service (GPRS), wideband code division multiple access (WCDMA) and long term evolution (LTE), etc. However, if different power amplifiers are disposed to correspondingly process the signals of different modes or different frequency bands, the area and cost of the wireless communication device can not be reduced.

Accordingly, what is needed is a wireless communication device, method and power amplifier of the same to address the above issues.

SUMMARY

An aspect of the present invention is to provide a power amplifier. The power amplifier includes a first and a second power amplifying paths, a first and a second selection circuits, first matching circuits and second matching circuits. The first power amplifying path receives a first input signal within a first frequency range, wherein the first input signal is further within one of a plurality of first frequency sub-bands of the first frequency range. The first matching circuits each includes a first circuit structure and a first matching parameter corresponding to one of the first frequency sub-bands. The first selection circuit is coupled between the first power amplifying path and the first matching circuits to select one of the first matching circuits according to a frequency band where the first input signal is located therein to perform a first matching process on the first input signal to generate a first output signal. The second power amplifying path receives a second input signal within a second frequency range, wherein the second input signal is further within one of a plurality of second frequency sub-bands of the second frequency range, and frequencies of the second frequency range are higher than those of the first frequency range. The second matching circuits each includes a second circuit structure and a second matching parameter corresponding to one of the second frequency sub-bands. The second selection circuit is coupled between the second power amplifying path and the second matching circuits to select one of the second matching circuits according to the frequency band where the second input signal is located therein to perform a second matching process on the second input signal to generate a second output signal.

Another aspect of the present invention is to provide a wireless communication device. The wireless communication device includes a power amplifier and an antenna. The power amplifier includes a first and a second power amplifying paths, a first and a second selection circuits, first matching circuits and second matching circuits. The first power amplifying path receives a first input signal within a first frequency range, wherein the first input signal is further within one of a plurality of first frequency sub-bands of the first frequency range. The first matching circuits each includes a first circuit structure and a first matching parameter corresponding to one of the first frequency sub-bands. The first selection circuit is coupled between the first power amplifying path and the first matching circuits to select one of the first matching circuits according to a frequency band where the first input signal is located therein to perform a first matching process on the first input signal to generate a first output signal. The second power amplifying path receives a second input signal within a second frequency range, wherein the second input signal is further within one of a plurality of second frequency sub-bands of the second frequency range, and frequencies of the second frequency range are higher than those of the first frequency range. The second matching circuits each includes a second circuit structure and a second matching parameter corresponding to one of the second frequency sub-bands. The second selection circuit is coupled between the second power amplifying path and the second matching circuits to select one of the second matching circuits according to the frequency band where the second input signal is located therein to perform a second matching process on the second input signal to generate a second output signal. The antenna is coupled to the power amplifier to transmit the first and/or the second output signals.

Yet another aspect of the present invention is to provide a wireless communication method used in a wireless communication device. The wireless communication method includes the steps outlined below. A first input signal within a first frequency range is received by a first power amplifying path and/or a second input signal within a second frequency range is received by a second power amplifying path, wherein the first input signal is further within one of a plurality of first frequency sub-bands of the first frequency range, the second input signal is further within one of a plurality of second frequency sub-bands of the second frequency range, and frequencies of the second frequency range are higher than those of the first frequency range. One of a plurality of first matching circuits is selected according to a frequency band where the first input signal is located therein to perform a first matching process on the first input signal to generate a first output signal, and/or one of a plurality second matching circuits is selected according to the frequency band that the second input signal is located therein to perform a second matching process on the second input signal to generate a second output signal, wherein each of the first matching circuits comprises a first circuit structure and a first matching parameter corresponding to one of the first frequency sub-bands and each of the second matching circuits comprises a second circuit structure and a second matching parameter corresponding to one of the second frequency sub-bands. The first and/or the second output signals are transmitted by an antenna.
}

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
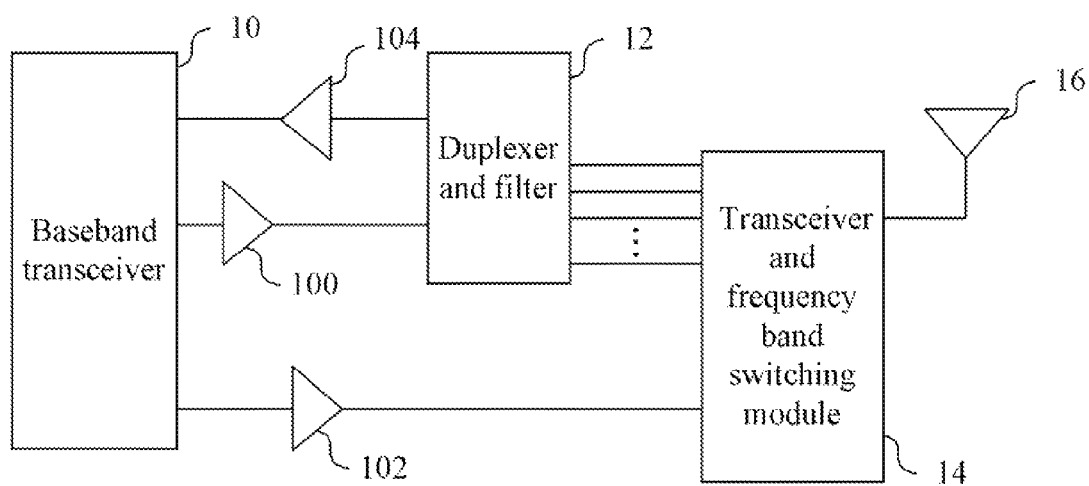
FIG. 1 is a block diagram of a wireless communication device in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a wireless communication device 1 in an embodiment of the present invention. The wireless communication device 1 includes a baseband transceiver 10, a duplexer and filter 12, a transceiver and frequency band switching module 14 and an antenna 16.

As illustrated in FIG. 1, in the aspect of data transmission, the baseband transceiver 10 generates data signals of 3rd generation (3G) or 4th generation (4G) mobile communication technology such that the data signals are amplified and matched by a power amplifier 100, further processed by the duplexer and filter 12 and the transceiver and frequency band switching module 14 and transmitted by the antenna 16.

In the data receiving aspect, the data signal received by the antenna 16 is processed by the transceiver and frequency band switching module 14 and the duplexer and filter 12, is amplified and matched by the low noise amplifier (LNA) 104 and is received by the baseband transceiver 10.

Figure 2:
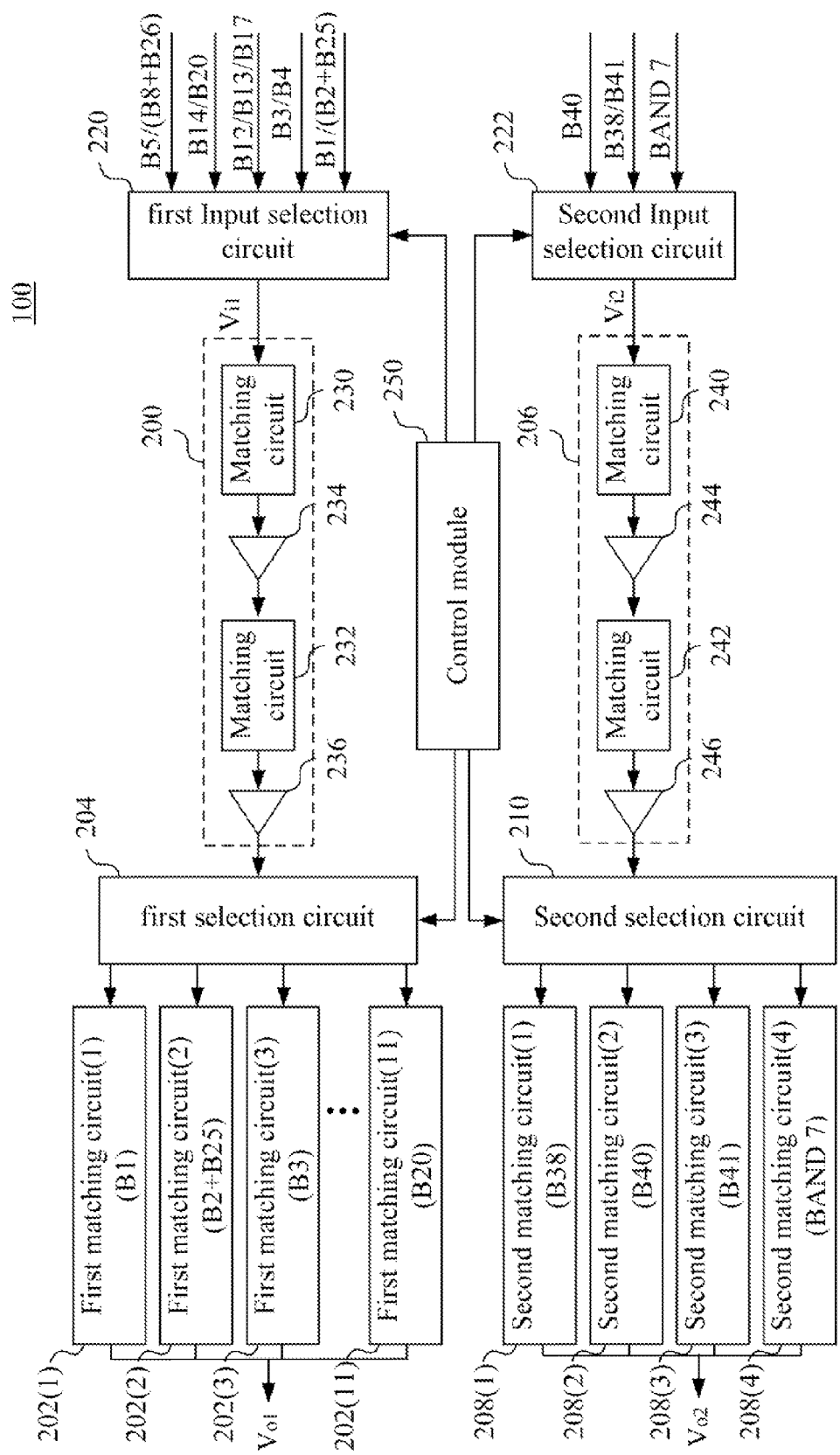
FIG. 2 is a block diagram of the power amplifier in an embodiment of the present invention.

FIG. 2 is a block diagram of the power amplifier 100 in an embodiment of the present invention. The power amplifier 100 includes a first power amplifying path 200, first matching circuits 202(1)-202(11) (labeled as the texts of first matching circuits (1)-(11) in FIG. 2), a first selection circuit 204, a second power amplifying path 206, second matching circuits 208(1)-208(4) (labeled as the texts of second matching circuits (1)-(4) in FIG. 2), a second selection circuit 210.

The power amplifier 100 receives a first input signal Vi1 within a first frequency range or a second input signal Vi2 within a second frequency range, wherein the frequencies of the second frequency range are higher than those of the first frequency range. In an embodiment, the first frequency range is from 700 MHz to 2000 MHz, and the second frequency range is from 2000 MHz to 2700 MHz. The first input signal Vi1 and the second input signal Vi2 are radio frequency (RF) signals.

The power amplifier 100 further performs power amplification on the first input signal Vi1 and/or the second input signal Vi2 to generate a first output signal Vo1 and/or a second output signal Vo2.

The first power amplifying path 200 receives the first input signal Vi1 within the first frequency range. In an embodiment, the power amplifier 100 further includes a first input selection circuit 220 to select the first input signal Vi1 in one of a plurality of first input frequency sub-bands, Take the definition of the long term evolution (LTE) technology as an example, the first input selection circuit 220 performs selection from five frequency bands corresponding to B5/(B8+B26), B14/B20, B12/B13/B17, B3/B4 and B1/(B2+B25) to receive the first input signal Vi1. Each of B1, B2, B3 . . . mentioned above corresponds to a frequency band around a specific frequency. For example, B2 approximately corresponds to the frequency band around 1900 MHz, and B12 approximately corresponds to the frequency band around 700 MHz.

It is noted that the number of frequency bands and the range of the frequency bands mentioned above are merely an example. The present invention is not limited thereto. Moreover, in different embodiments, the first input selection circuit 220 can be implemented by a multiplexer, a multiple-pole-single-throw switch or other modules that is capable of performing the selection of the signal sources. For example, the first input selection circuit 220 can be implemented by a five-pole-single-throw switch.

In an embodiment, the first power amplifying path 200 includes a plurality of stages of matching circuits and a plurality of stages of amplifying circuits, such as but not limited to the matching circuits 230, 232 and the amplifying circuits 234, 236 illustrated in FIG. 2. The matching circuits 230, 232 and the amplifying circuits 234, 236 perform amplifying and matching process on the first input signal Vi1.

Each of the first matching circuits 202(1)-202(11) corresponds to a plurality of first frequency sub-bands of the first frequency range. Take the LTE technology as an example, eleven first matching circuits 202(1)-202(11) are disposed to correspond to the signal's in the eleven frequency sub-bands B1, B2+B25, B3, B4, B5, B8+B26, B12, B13, B14, B17 and B20 to perform the processes of such as, but not limited to power matching, impedance matching or a combination of the above.

In FIG. 2, the first matching circuits 202(1)-202(11) that corresponds to the frequency sub-bands B1, B2+B25, B3, . . . and B20 are exemplarily illustrated. The first matching circuits 202(1)-202(11) can have circuit structures and/or matching parameters different from each other. For example, the circuit structure of the first matching circuits 202(1)-202(11) may include various kinds of inductor-capacitor (LC) circuits that has capacitors and inductors (not illustrated), and may include parameters of the circuit elements such as different capacitances and inductances.

It is noted that the number of frequency bands and the range of the frequency bands mentioned above are merely an example. The present invention is not limited thereto.

The first selection circuit 204 is coupled between the first power amplifying path 200 and the first matching circuits 202(1)-202(11) to select one of the first matching circuits 202(1)-202(11) according to a frequency band where the first input signal Vi1 is located therein to perform a first matching process mentioned above on the first input signal Vi1 to generate a first output signal Vo1.

In different embodiments, the first selection circuit 204 can be implemented by a multiplexer, a multiple-pole-single-throw switch or other modules that is capable of performing the selection of the signal sources. For example, the first selection circuit 204 can be implemented by a one-pole-eleven-throw switch.

The second power amplifying path 206 receives the second input signal Vi2 within the second frequency range. In an embodiment, the power amplifier 100 further includes a second input selection circuit 222 to select the second input signal Vi2 in one of a plurality of second input frequency sub-bands. Take the definition of the LTE technology as an example, the second input selection circuit 222 performs selection from five frequency bands corresponding to B40, B38/B41 and B7 to receive the second input signal Vi2. Each of B40, B38, B41 . . . mentioned above corresponds to a frequency band around a specific frequency. For example, B38 approximately corresponds to the frequency band around 2500 MHz, and B40 approximately corresponds to the frequency band around 2300 MHz.

It is noted that the number of frequency bands and the range of the frequency bands mentioned above are merely an example. The present invention is not limited thereto. Moreover, in different embodiments, the second input selection circuit 222 can be implemented by a multiplexer, a multiple-pole-single-throw switch or other modules that is capable of performing the selection of the signal sources. For example, the second input selection circuit 222 can be implemented by a three-pole-single-throw switch.

In an embodiment, the second power amplifying path 206 includes a plurality of stages of matching circuits and a plurality of stages of amplifying circuits, such as but not limited to the matching circuits 240, 242 and the amplifying circuits 244, 246 illustrated in FIG. 2. The matching circuits 240, 242 and the amplifying circuits 244, 246 perform amplifying and matching process on the second input signal Vi2.

Each of the second matching circuits 208(1)-208(4) corresponds to a plurality of second frequency sub-bands of the second frequency range. Take the LTE technology as an example, four second matching circuits 208(1)-208(4) are disposed to correspond to the signals in the four frequency sub-bands B38, B40, B41 and B7 to perform the processes of such as, but not limited to power matching, impedance matching or a combination of the above.

In FIG. 2, the second matching circuits 208(1)-208(4) that corresponds to the frequency sub-bands B38, B40, B41 and B7 are exemplarily illustrated. The second matching circuits 208(1)-208(4) can have circuit structures and/or matching parameters different from each other. For example, the circuit structure of the second matching circuits 208(1)-208(4) may include various kinds of inductor-capacitor (LC) circuits that has capacitors and inductors (not illustrated), and may include parameters of the circuit elements such as different capacitances and inductances.

It is noted that the number of frequency bands and the range of the frequency bands mentioned above are merely an example. The present invention is not limited thereto.

The second selection circuit 210 is coupled between the second power amplifying path 206 and the second matching circuits 208(1)-208(4) to select one of the second matching circuits 208(1)-208(4) according to a frequency band where the second input signal Vi2 is located therein to perform a second matching process mentioned above on the second input signal Vi2 to generate a second output signal Vo2.

In different embodiments, the second selection circuit 210 can be implemented by a multiplexer, a multiple-pole-single-throw switch or other modules that is capable of performing the selection of the signal sources. For example, the second selection circuit 210 can be implemented by a one-pole-four-throw switch.

In an embodiment, the power amplifier further includes a control module 250 to control the first selection circuit 204, the second selection circuit 206, the first input selection circuit 220 and the second input selection circuit 222 to perform selections.

The wireless communication device 1 of the present invention can make use of the design of the power amplifier 100 to receive signals in different frequency bands within a pretty wide frequency range under different modes with only one power amplifier circuit to perform power amplifying and matching processes.

Figure 3:
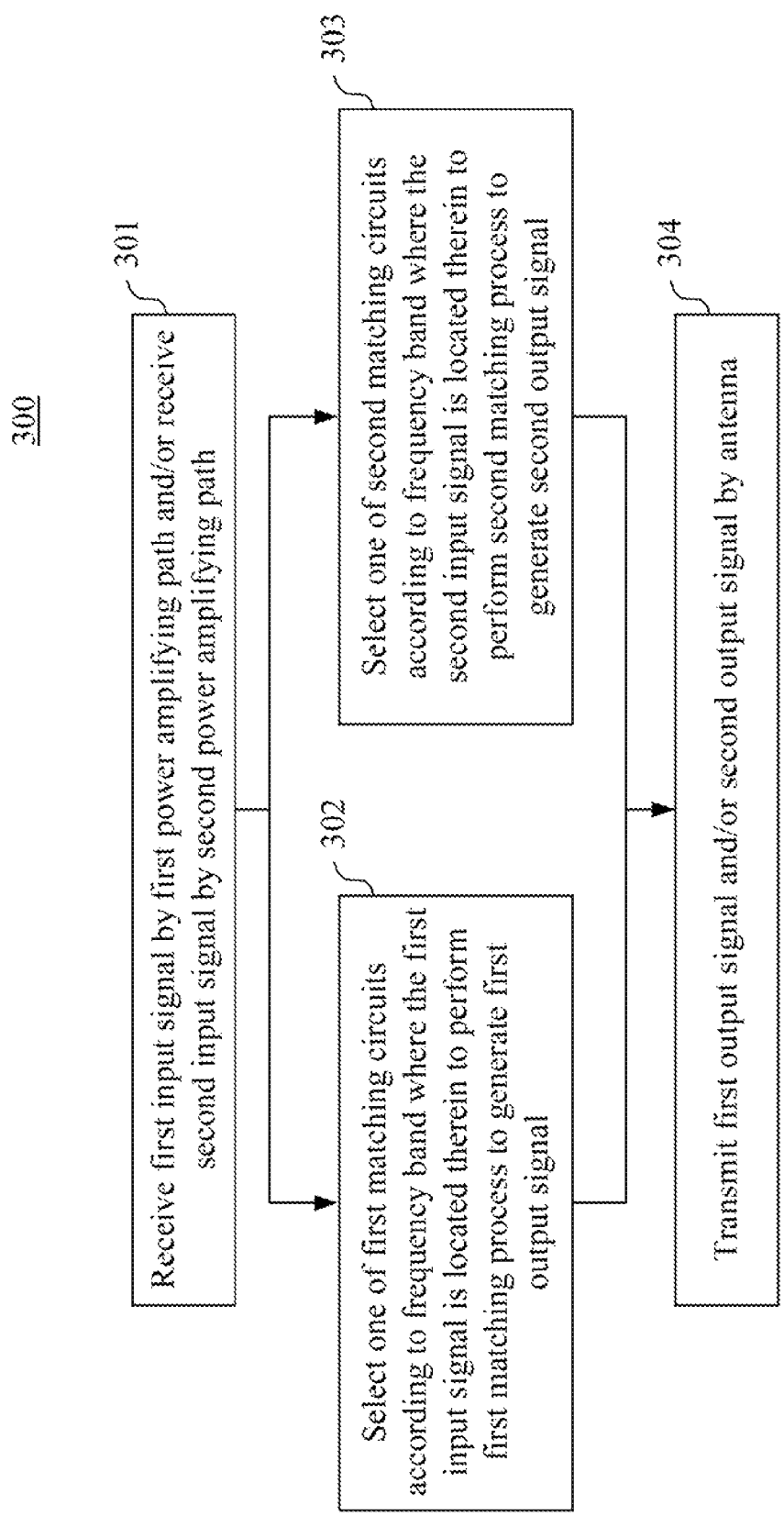
FIG. 3 is a flow chart of a wireless communication method in an embodiment of the present invention.

FIG. 3 is a flow chart of a wireless communication method 300 in an embodiment of the present invention. The wireless communication method 300 can be used in the wireless communication device 1 as illustrated in FIG. 1. The wireless communication method 300 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 301, the first input signal Vi1 within the first frequency range is received by the first power amplifying path 200 and/or the second input signal Vi2 within the second frequency range is received by the second power amplifying path 206, wherein the frequencies of the second frequency range are higher than those of the first frequency range.

In step 302, one of the first matching circuits 202(1)-202(11) is selected by the first selection circuit 204 according to the frequency band where the first input signal Vi1 is located therein to perform the first matching process on the first input signal Vi1 to generate the first output signal Vo1.

In step 303, one of the second matching circuits 208(1)-208(4) is selected by the second selection circuit 210 according to the frequency band where the second input signal Vi2 is located therein to perform the second matching process on the second input signal Vi2 to generate the second output signal Vo2.

In step 304, the first output signal Vo1 and/or the second output signal Vo2 are transmitted by the antenna 16.

Although the present invention has been described in considerable detail with reference to certain embodiments thereof, other embodiments are possible. Therefore, the spirit and scope of the appended claims should not he limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power amplifier, comprising:
  a first power amplifying path to receive a first input signal within a first frequency range, wherein the first input signal is further within one of a plurality of first frequency sub-bands of the first frequency range;
  a plurality of first matching circuits each comprising a first circuit structure and a first matching parameter corresponding to one of the first frequency sub-bands;
  a first selection circuit coupled between the first power amplifying path and the first matching circuits to select one of the first matching circuits according to a frequency band where the first input signal is located therein to perform a first matching process on the first input signal to generate a first output signal;
  a second power amplifying path to receive a second input signal within a second frequency range, wherein the second input signal is further within one of a plurality of second frequency sub-bands of the second frequency range, and frequencies of the second frequency range are higher than those of the first frequency range;

a plurality of second matching circuits each comprising a second circuit structure and a second matching parameter corresponding to one of the second frequency sub-bands; and a second selection circuit coupled between the second power amplifying path and the second matching circuits to select one of the second matching circuits according to the frequency band where the second input signal is located therein to perform a second matching process on the second input signal to generate a second output signal.

2. The power amplifier of claim 1, further comprising:

a first input selection circuit to select the first input signal in one of a plurality of first input frequency sub-bands to input the first input signal to the first power amplifying path; and a second input selection circuit to select the second input signal in one of a plurality of second input frequency sub-bands to input the second input signal to the second power amplifying path.

3. The power amplifier of claim 2, further comprising a control module to control the first selection circuit, the second selection circuit, the first input selection circuit and the second input selection circuit to perform selections.

4. The power amplifier of claim 1, wherein the first power amplifying path comprises a plurality of stages of matching circuits and a plurality of stages of amplifying circuits connected in series to perform an amplifying and matching process on the first input signal.

5. The power amplifier of claim 1, wherein the second power amplifying path comprises a plurality of stages of matching circuits and a plurality of stages of amplifying circuits connected in series to perform an amplifying and matching process on the second input signal.

6. The power amplifier of claim 1, wherein the first matching process and the second matching process each comprises a power matching process, an impedance matching process or a combination of the above.

7. The power amplifier of claim 1, wherein the first frequency range is from 700 MHz to 2000 MHz, and the second frequency range is from 2000 MHz to 2700 MHz.

8. A wireless communication device comprising:

a power amplifier comprising:

a first power amplifying path to receive a first input signal within a first frequency range, wherein the first input signal is further within one of a plurality of first frequency sub-bands of the first frequency range;

a plurality of first matching circuits each comprising a first circuit structure and a first matching parameter corresponding to one of the first frequency sub-bands;

a first selection circuit coupled between the first power amplifying path and the first matching circuits to select one of the first matching circuits according to a frequency band where the first input signal is located therein to perform a first matching process on the first input signal to generate a first output signal;

a second power amplifying path to receive a second input signal within a second frequency range, wherein the second input signal is further within one of a plurality of second frequency sub-bands of the second frequency range, and frequencies of the second frequency range are higher than those of the first frequency range;

a plurality of second matching circuits each comprising a second circuit structure and a second matching parameter corresponding to one of the second frequency sub-bands;

a second selection circuit coupled between the second power amplifying path and the second matching circuits to select one of the second matching circuits according to the frequency band where the second input signal is located therein to perform a second matching process on the second input signal to generate a second output signal, and an antenna coupled to the power amplifier to transmit the first and/or the second output signals.

9. The wireless communication device of claim 8, wherein the power amplifier further comprises:

a first input selection circuit to select the first input signal in one of a plurality of first input frequency sub-bands to input the first input signal to the first power amplifying path; and a second input selection circuit to select the second input signal in one of a plurality of second input frequency sub-bands to input the second input signal to the second power amplifying path.

10. The wireless communication device of claim 9, wherein the power amplifier further comprises a control module to control the first selection circuit, the second selection circuit, the first input selection circuit and the second input selection circuit to perform selections.

11. The wireless communication device of claim 8, wherein the first power amplifying path comprises a plurality of stages of matching circuits and a plurality of stages of amplifying circuits connected in series to perform an amplifying and matching process on the first input signal.

12. The wireless communication device of claim 8, wherein the second power amplifying path comprises a plurality of stages of matching circuits and a plurality of stages of amplifying circuits connected in series to perform an amplifying and matching process on the second input signal.

13. The wireless communication device of claim 8, wherein the first matching process and the second matching process each comprises a power matching process, an impedance matching process or a combination of the above.

14. The wireless communication device of claim 8, wherein the first frequency range is from 700 MHz to 2000 MHz, and the second frequency range is from 2000 MHz to 2700 MHz.

15. A wireless communication method used in a wireless communication device, comprising:

receiving a first input signal within a first frequency range by a first power amplifying path and/or receiving a second input signal within a second frequency range by a second power amplifying path, wherein the first input signal is further within one of a plurality of first frequency sub-bands of the first frequency range, the second input signal is further within one of a plurality of second frequency sub-bands of the second frequency range, and frequencies of the second frequency range are higher than those of the first frequency range;

selecting one of a plurality of first matching circuits according to a frequency band where the first input signal is located therein to perform a first matching process on the first input signal to generate a first output signal, and/or selecting one of a plurality of second matching circuits according to a frequency band where the second input signal is located therein to perform a second matching process on the second input signal to generate a second output signal, wherein each of the first matching circuits comprises a first circuit structure and a first matching parameter corresponding to one of the first frequency sub-bands and each of the second matching circuits comprises a second circuit structure and a second matching parameter corresponding to one of the second frequency sub-bands; and transmitting the first and/or the second output signals by an antenna.

16. The wireless communication method of claim 15, further comprising:

selecting the first input signal in one of a plurality of first input frequency sub-bands by a first input selection circuit to input the first input signal to the first power amplifying path; and/or selecting the second input signal in one of a plurality of second input frequency sub-bands by a second input selection circuit to input the second input signal to the second power amplifying path.

17. The wireless communication method of claim 15, further comprising performing an amplifying and matching process on the first input signal by the first power amplifying path.

18. The wireless communication method of claim 15, further comprising performing an amplifying and matching process on the second input signal by the second power amplifying path.

19. The wireless communication method of claim 15, wherein the first matching process and the second matching process each comprises a power matching process, an impedance matching process or a combination of the above.

20. The wireless communication method of claim 15, wherein the first frequency range is from 700 MHz to 2000 MHz, and the second frequency range is from 2000 MHz to 2700 MHz.

* * * * *